(12) United States Patent  (10) Patent No.: US 6,720,826 B2
Yoon  (45) Date of Patent: Apr. 13, 2004

(54) TRANSIMPEDANCE AMPLIFIER

(75) Inventor: Taesub Ty Yoon, Calabasas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/456,064

(22) Filed: Jun. 6, 2003

(65) Prior Publication Data

US 2003/0214353 A1 Nov. 20, 2003

Related U.S. Application Data

(63) Continuation of application No. 10/074,397, filed on Feb. 11, 2002, now Pat. No. 6,593,810.
(60) Provisional application No. 60/276,583, filed on Mar. 16, 2001.

(51) Int. Cl.[7] .............................. H03F 3/45; H03F 1/36; H03F 3/08; H01J 40/14
(52) U.S. Cl. ..................... 330/69; 330/86; 330/110; 330/308; 250/214 A; 250/214 AG
(58) Field of Search .................. 330/69, 86, 110, 330/308; 250/214 A, 214 AG

(56) References Cited

U.S. PATENT DOCUMENTS

| | | | |
|---|---|---|---|
| 4,841,254 A | * | 6/1989 | Bukowski et al. .......... 330/253 |
| 4,970,470 A | | 11/1990 | Gosser ........................ 330/252 |
| 5,801,588 A | | 9/1998 | Nishiyama ................... 330/308 |
| 6,175,438 B1 | * | 1/2001 | Agarwal et al. ............. 398/212 |
| 6,288,387 B1 | | 9/2001 | Black et al. ............. 250/214 A |
| 6,292,052 B1 | | 9/2001 | Carlson .......................... 330/9 |

OTHER PUBLICATIONS

U.S. 2003/0025562 A1 of Andreou et al., Low Power, Differential Optical Receiver In Silicon on Insulator.*

* cited by examiner

*Primary Examiner*—Patricia Nguyen
(74) *Attorney, Agent, or Firm*—Pillsbury Winthrop LLP

(57) ABSTRACT

A transimpedance amplifier system includes a first gain stage to receive an input signal. A second gain stage is coupled to the first gain stage to provide a first output. A first passive feedback element is coupled in parallel with the second gain stage. A general feedback element is coupled in parallel with the first gain stage and the second gain stage. A replica biasing stage is included to provide a second output. A replica feedback element is coupled in parallel with the replica biasing stage.

22 Claims, 8 Drawing Sheets

TRANSIMPEDANCE AMPLIFIER

This is a continuation of application Ser. No. 10/074,397, filed Feb. 11, 2002 now U.S. Pat. No. 6,593,810, which claims the benefit of Provisional application No. 60/276,583 filed Mar. 16, 2001.

BACKGROUND OF THE INVENTION

1. Field of the Invention

The present invention generally relates to fiber optic communication. More particularly, the present invention relates to a system and method for implementing a transimpedance amplifier ("TIA") that is used in processing fiber optic communication data and capable of operating at and beyond 2.5 Gigabits-per-second ("Gb/s").

2. Discussion of the Related Art

Optical signals are increasingly being used to communicate between electronic processing devices. As a result, low-cost, high-performance fiber optic interface systems are becoming increasingly necessary. One integral component for fiber optic communication systems is a TIA. TIAs are commonly used for providing a voltage signal proportional to a current signal and are normally implemented by providing a feedback resistor across the input and output nodes of an operational amplifier. One use of a TIA is to convert an input current signal, which is indicative of an optical signal from a fiber optic line, into an output voltage signal.

In optical receiver modules, TIAs generally function as low-noise pre-amplifiers, which largely determines the overall performance of the optical module. In the past, because of the wide bandwidth and the high gain necessary for sensitive data links, TIAs have been implemented with bipolar and gallium arsenide ("GaAs") metal-semiconductor field effect transistors ("MESFET"). These implementations result in high speed processing, but they can be costly and lack high-yield manufacturability.

Recently, metal-oxide-semiconductor ("MOS") technology has become popular for the design of TIAs because of its low cost and high-yield manufacturability. However, using a single MOS gain stage fails to provide enough gain for multi-gigabit operation, because MOS transistors have a lower transconductance than bipolar transistors. Hence, successful high-speed MOS implementations have relied on multiple gain stages, while using various degeneration methods to control the stability of the TIA. One prior art design ("Design #1") is an n-channel metal-oxide-semiconductor ("NMOS") TIA, having three common-source NMOS amplifiers with depletion mode loads constituting the open loop voltage amplifier. A local feedback is applied around the second gain stage to degenerate the gain. A similar second prior art design ("Design #2") utilizes three complementary metal-oxide-semiconductor ("CMOS") amplifiers with diode-connected NMOS devices to control gain for the inverting CMOS amplifiers. However, neither Design #1 nor Design #2 is able to achieve an operating speed of 2.5 Gb/s. Design #1 operates at 1.0 Gb/s and 1.5 Gb/s, and Design #2 operates between 50 Megabits/second ("Mb/s") and 240 Mb/s. Moreover, Design #2 uses multi-gain stages to increase bandwidth, but no degeneration scheme is employed to control phase margin. Furthermore, in Design #2 only a large feedback resistor is used to control stability, resulting in a degraded overall bandwidth performance.

In an optical receiver module, an optical signal emerging from the fiber is converted to an electrical current by a photodiode, which is then amplified by a TIA. Input power incident on the photodiode preceding the TIA can vary greatly. Sometimes the variation can lead to a current input as large as 2 mA. For good noise performance, the TIA should have a transimpedance gain higher than 1 kΩ. However, a large current input can saturate the amplifier, leading to pulse-width distortion and bit errors. To alleviate this problem, numerous gain control techniques have been employed. In a third prior art design ("Design #3"), U.S. Pat. No. 5,532,471, transimpedance feedback gain is lowered as a function of input drive. In Design #3, two circuit elements (one p-channel metal-oxide-semiconductor ("PMOS") and one NMOS) are used to control the open loop gain, while a third element (NMOS) controls the transimpedance gain. Therefore, three elements are utilized to operate an automatic gain control ("AGC") scheme, leading to a more complicated structure. Moreover, the use of both NMOS and PMOS to control the open loop gain can lead to additional process variations, because NMOS and PMOS device characteristics do not necessarily track each other.

In the TIA system disclosed in another prior art design ("Design #4"), U.S. Pat. No. 5,602,510, the gain control drive that lowers the transimpedance gain is generated directly from the output of the TIA itself, which may lead to an ambiguous and process-dependent threshold for the activation of the gain control mechanism. This configuration may cause degraded sensitivity if gain control is turned on prematurely. Therefore, there is a need for a system and method that provide a more robust transimpedance gain control mechanism with a process independent threshold.

The use of clamping diodes as a gain control technique is employed in a fifth prior art MESFET design ("Design #5"), U.S. Pat. No. 5,646,573. However, such designs are not very amenable to a CMOS implementation, due to the lack of high-speed diodes in CMOS technology. Therefore, there is a need to provide a system and method for implementing a TIA that accommodates better than 2 mA of current and is capable of operating at 2.5 Gb/s and beyond.

DETAILED DESCRIPTION

Reference in the specification to "one embodiment", "an embodiment", or "another embodiment" of the present invention means that a particular feature, structure or characteristic described in connection with the embodiment is included in at least one embodiment of the present invention. Thus, the appearances of the phrase "in one embodiment" or "according to an embodiment" appearing in various places throughout the specification are not necessarily all referring to the same embodiment. Likewise, appearances of the phrase "in another embodiment" or "according to another dembodiment" appearing in various places throughout the specification are not necessarily referring to different embodiments.

Figure 1:
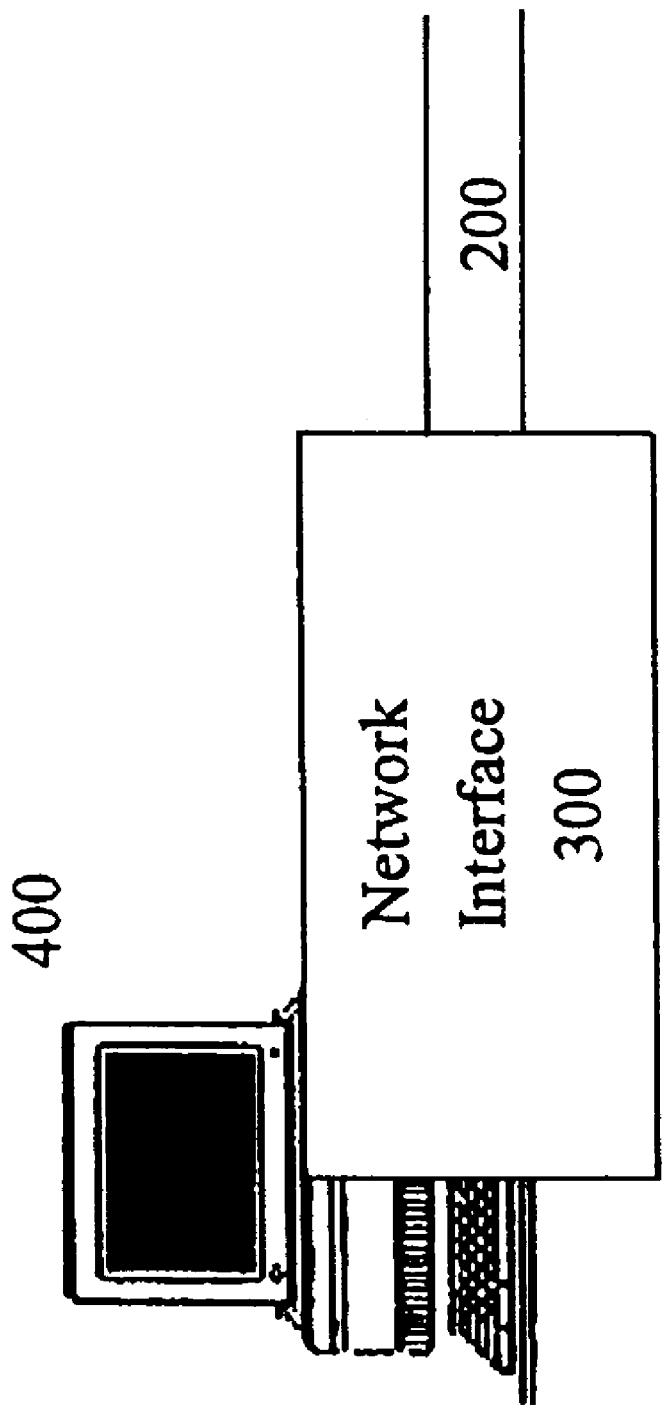
FIG. 1 shows an optical network system according to an embodiment of the present invention.

FIG. 1 shows an optical network system according to an embodiment of the present invention. At a receiving end or transmission end of a typical optical network system, conversions are constantly made between digital data and optical signals. To make such conversions possible, an interface is needed between an optical fiber line and a receiver and/or transmitter. The optical network system, as shown in FIG. 1, includes an optical fiber line 200, a network interface 300 and a data processing device 400. The data processing device 400 may be any kind of electronic device, including a computer system. The optical fiber line 200 carries optical signals to and from the network interface 300. In the receiving mode, components in the network interface 300 convert a received optical signal into electrical energy. The electrical energy is often amplified, processed, manipulated and/or converted between different forms, resulting in the recovery of digital data from the received optical signal. In the transmitting mode, the sequence of processing and conversion is reversed. The data processing device 400 processes the digital data and converts it to an optical signal.

Figure 2:
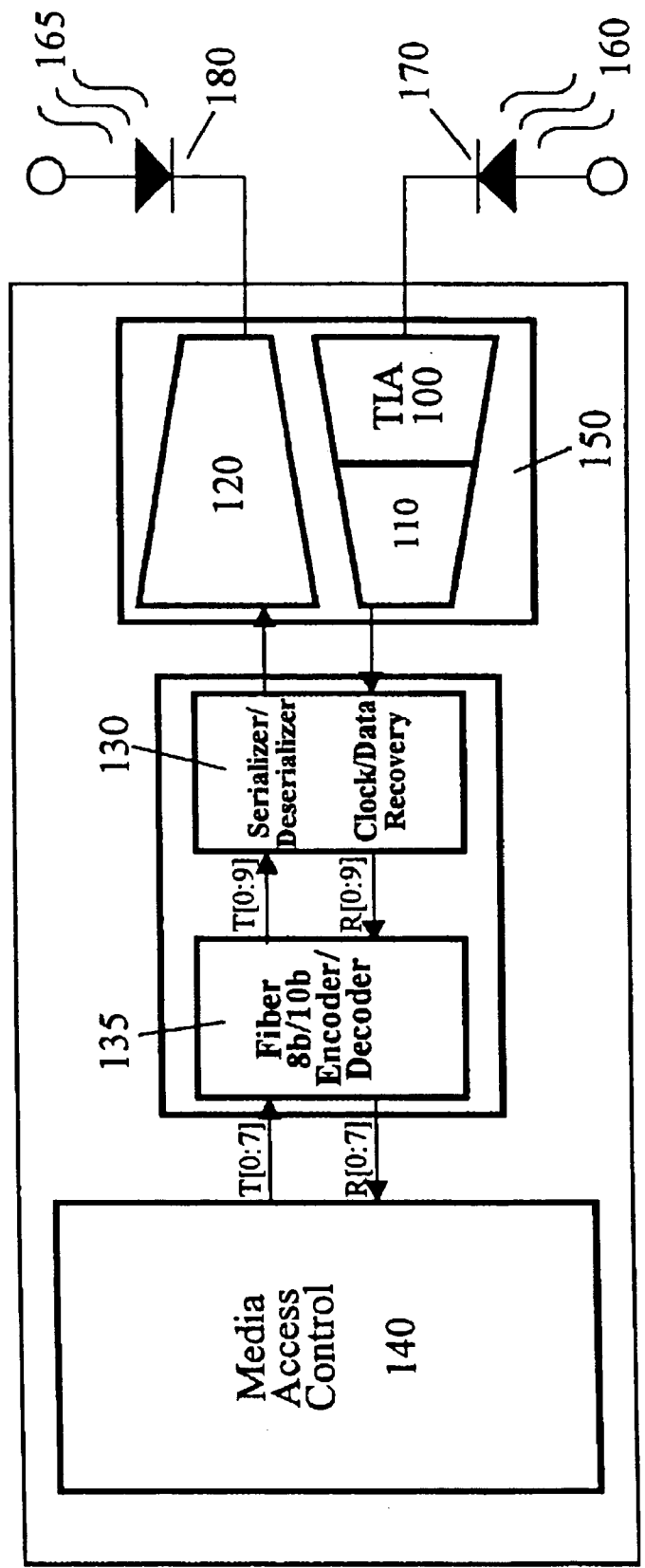
FIG. 2 shows a block diagram of a network interface according to an embodiment of the present invention.

FIG. 2 shows a block diagram of a network interface according to an embodiment of the present invention. In the embodiment, the network interface may be a Peripheral Component Interconnect ("PCI") interface 300 that serves as an interface between an optical fiber line and a computer system. The PCI interface 300 is often embodied in a network interface card. The PCI interface 300 may comprise an optical receiver/transmitter module 150, a recovery module 130, an encoding/decoding module 135 and a media access control ("MAC") module 140. The optical receiver/transmitter module 150 may include a TIA 100 and a limiting amplifier 110 for the receiving mode and a laser driver 120 for the transmitting mode. In the receiving mode, optical signals 160 travel through the optical fiber line and are incident on a photo-detector 170, where optical energy, in the form of photons, is converted into electrical energy. The output from the photo-detector 170 is an electrical current, $I_{in}$, which is proportional to the received optical signals. The TIA 100 converts $I_{in}$ into an output voltage, which is fed to the limiting amplifier 110. In one embodiment, the limiting amplifier 110 may amplify the TIA output voltage to a level that can be processed by the recovery module 130, and more particularly, a digital clock and data recovery circuit in the recovery module 130. The recovered data is often sent to the encoding/decoding module 135 to be further decoded into a format that may be analyzed by the MAC module 140. The MAC module 140 may, for example, be implemented by CMOS application specific integrated circuits ("ASICs"), and it allows data to move to specified locations within a system.

In the transmitting mode, the process is reversed. In one implementation, digital data may be provided from the MAC module 140 to the encoding/decoding module 135, where the digital data may be encoded into a format that is optimum for converting it into optical signals. If the digital data were already in proper form, processing it by the encoding/decoding module 135 would not be necessary. Sometimes, the encoded digital data needs to be serialized (or deserialized). In such case, the encoded digital data may be fed to the recovery module 130, and more particularly, a serializer (or deserializer) in the recovery module 130. The output from the recovery module 130 may be fed to the laser driver 120, which may be included in the optical receiver/transmitter module 150. Based on the input electrical energy, the laser driver may activate a photo-emitter 180. Optical energy may be created and optical signals 165 may be provided from the PCI interface 300 to the fiber optic line via the photo-emitter 180.

Figure 3:
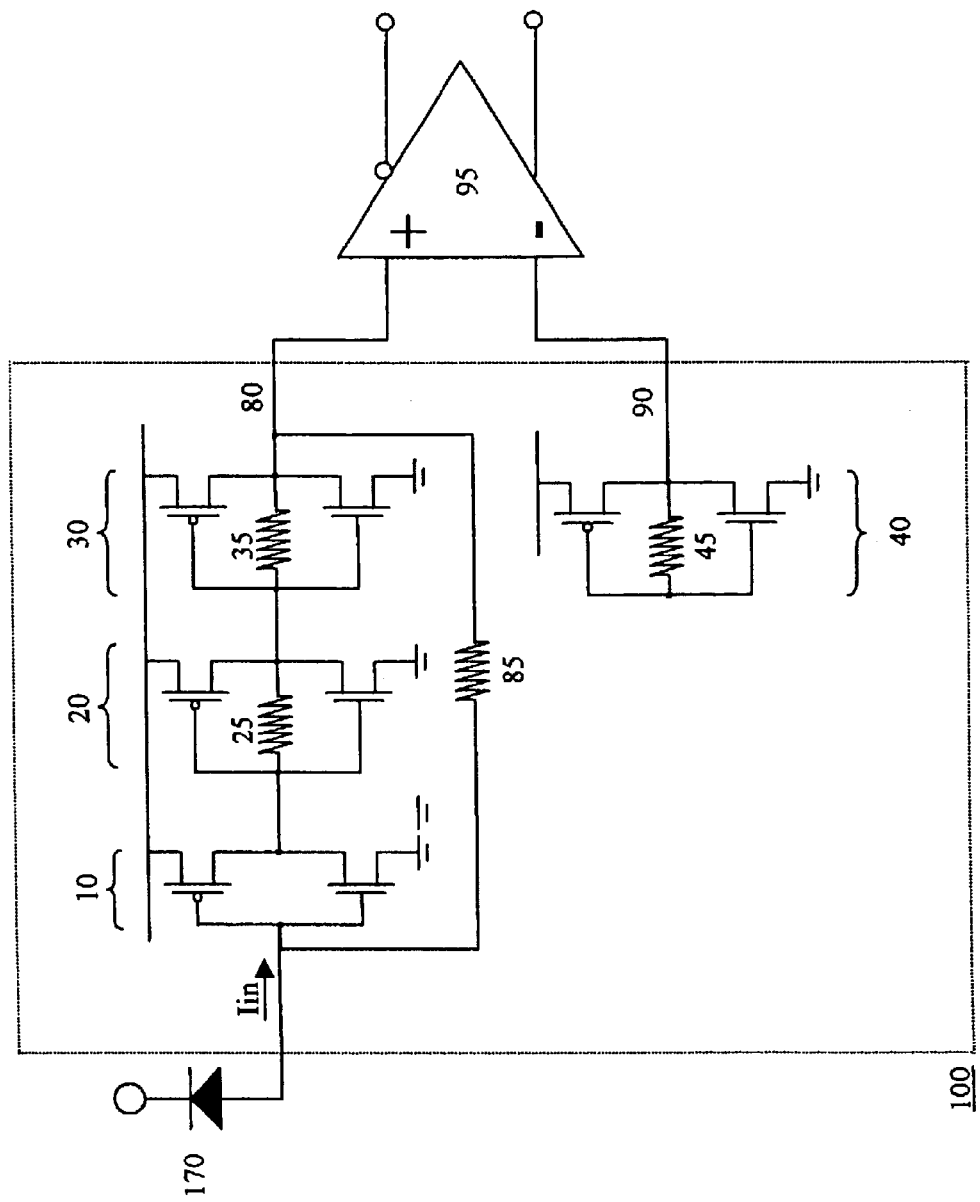
FIG. 3 shows a multi-stage CMOS TIA system with local degeneration and replica biasing according to an embodiment of the present invention.

FIG. 3 shows a multi-stage CMOS TIA system with local degeneration and replica biasing in accordance with an embodiment of the present invention. However, the TIA system may be designed using any suitable process, such as bipolar or GaAs MESFET. In a preferred embodiment, three gain stages 10, 20, 30 are cascaded in the TIA 100. In other embodiments, two gain stages may be cascaded or more than three gain stages may be cascaded. The input current, $I_{in}$, created from the optical signals striking the photo-detector 170, is fed to the input of the first gain stage 10, the output of which is the input of the second gain stage 20. A first passive feedback element 25 is applied around the second gain stage 20, which lowers the output impedance of the TIA 100. The first passive feedback element 25 may, for example, be implemented by a resistor, which can be realized by, for example, an n-channel device or an n-channel device coupled in parallel with a capacitor. By adding a second passive feedback element 35 around the third gain stage 30, the output impedance of the TIA 100 may be further lowered. This further improves the stability of the TIA 100. As a result of the local degeneration provided by the first passive feedback element 25 and the second passive feedback element 35, output impedance may be lowered and the stability of the TIA 100 may be improved. Furthermore, a general feedback element 85 may be coupled in parallel with the first gain stage 10, the second gain stage 20, and the third gain stage 30 to further improve the stability of the TIA 100.

A differential output is generated by using a replica biasing stage 40 having a DC point that tracks the DC point of the TIA 100. The replica biasing stage 40 is self-biased, with a replica feedback element 45 positioned across an input and an output of the replica biasing stage 40. In this fashion, the replica biasing stage 40 acts as a bias generator. In a preferred embodiment, a first input of a differential amplifier 95 may receive the first output 80 from the three gain stages 10, 20, 30. A second input of the differential amplifier 95 may receive a second output 90 from the replica biasing stage 40. The differential amplifier 95 may act as an output buffer, intended to drive an off-chip 50 Ω transmission line. With replica biasing, the power supply rejection ratio ("PSRR") is improved.

Figure 4:
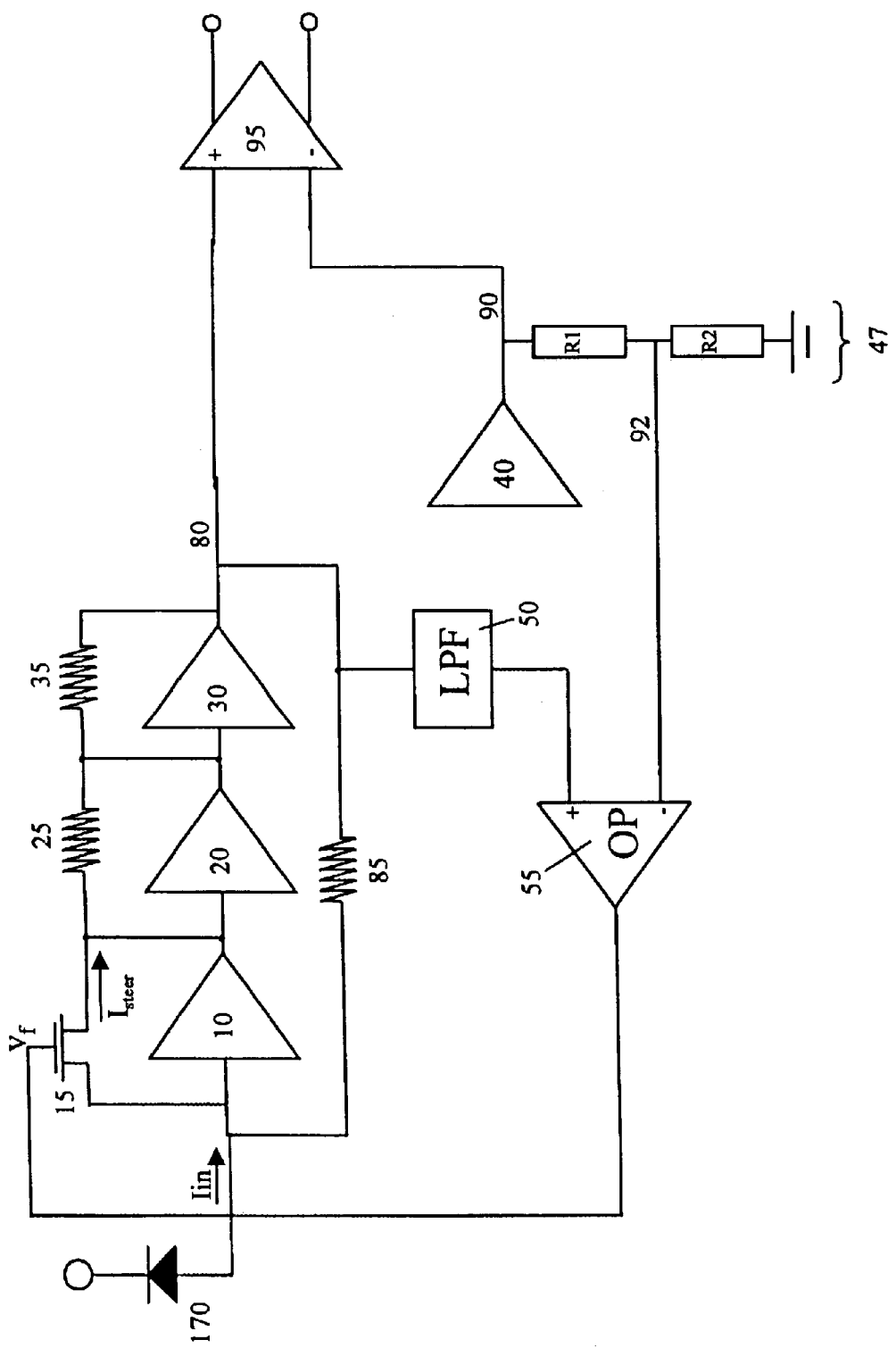
FIG. 4 shows an illustrative example of a multi-stage TIA system with AGC according to an embodiment of the present invention.

FIG. 4 shows an illustrative example of a multi-stage TIA system with an Automatic Gain Control ("AGC") implementation in accordance with an embodiment of the present invention. AGC is implemented by applying a degenerative feed-forward element 15 around the first gain stage 10, the degenerative feed-forward element 15 being controlled by the output, $V_f$, of an operational amplifier ("op amp") 55. With the degenerative feed-forward element 15, both the open loop gain and the transimpedance gain are lowered simultaneously. The open loop gain is lowered because the degenerative feed-forward element 15 is one of the load elements that set the voltage gain of the first gain stage 10. The open loop gain of the first gain stage 10 may be equal to $(Gm_p+Gm_n) \times (R_{op} \| R_{on} \| R_f)$, where $Gm_p$ and $Gm_n$ represent transconductance associated with the PMOS and NMOS transistors of the first gain stage 10. $R_{op}$ and $R_{on}$ represent output resistances of the PMOS and NMOS transistors, and $R_f$ represents resistance of the degenerative feed-forward element 15. Hence, lowering the resistance of the degenerative feed-forward element 15 reduces the open-loop gain. Moreover, transimpedance gain is reduced because the degenerative feed-forward element 15 steers photodiode current, $I_{steer}$, away from the input of the TIA. With the degenerative feed-forward element 15 simultaneously lowering the transimpedance gain as well as the open loop gain, an extremely robust gain control mechanism is achieved. This ensures that the two gain mechanisms track each other and maintain robust operation over process, temperature and power supply variations.

The degenerative feed-forward element 15 is illustratively an NMOS transistor that has its gate coupled to the output, $V_f$, of an op amp 55 in an AGC loop, its drain coupled to the output of the first gain stage 10, and its source coupled to the input of the first CMOS gain stage 10. The AGC loop may comprise a low pass filter ("LPF") 50 having its input coupled to the output of the TIA system 100, the op amp 55 having its first input coupled to the output of the LPF 50, a resistor divider network 47 coupled to the second input of the op amp 55 and to the output of the replica biasing stage 40, and the degenerative feed-forward element 15. The replica biasing stage 40 of FIG. 3 is same as the replica biasing stage 40 of FIG. 4. FIG. 3 provides an element representation of the replica biasing stage 40; whereas, FIG. 4 provides a block representation of the replica biasing stage 40. In the present invention, the AGC threshold is generated precisely from the resistor divider network 47 tapped from the output of the replica biasing stage 40. In one implementation, the resistor divider network 47 includes two resistors, R1 and R2. The first output 80 of the TIA may be fed to the LPF 50, which prevents undesirable high-frequency information from passing through the AGC loop and modulating the input signal. The output of the LPF 50 may be fed to the first input of the op amp 55. The second input of the op amp 55 is coupled to the output of the replica biasing stage 40 via the resistor divider network 47. Because of the resistor divider network 47, the second input of the op amp 55 receives a scaled output 92 from the replica biasing stage 40, which is equal to $V_o \times (R2/(R1+R2))$, where $V_o$ represents the second output 90 of the replica biasing stage 40. In one embodiment, the value of R2 is approximately nine times the value of R1. The AGC is activated only when the first output 80 of the TIA is greater than the scaled output 92 from the resistor divider network 47. Once the AGC is activated, the op amp 55 in the AGC loop may generate the necessary drive that ensures that the TIA's first output 80 does not venture beyond the threshold. Unlike prior art implementations, the present invention does not have a gain control drive that lowers the transimpedance gain being generated directly from the first output 80 of the TIA itself. As a result, an ambiguous and process dependent threshold for activation of the gain control mechanism is avoided.

Figure 5:
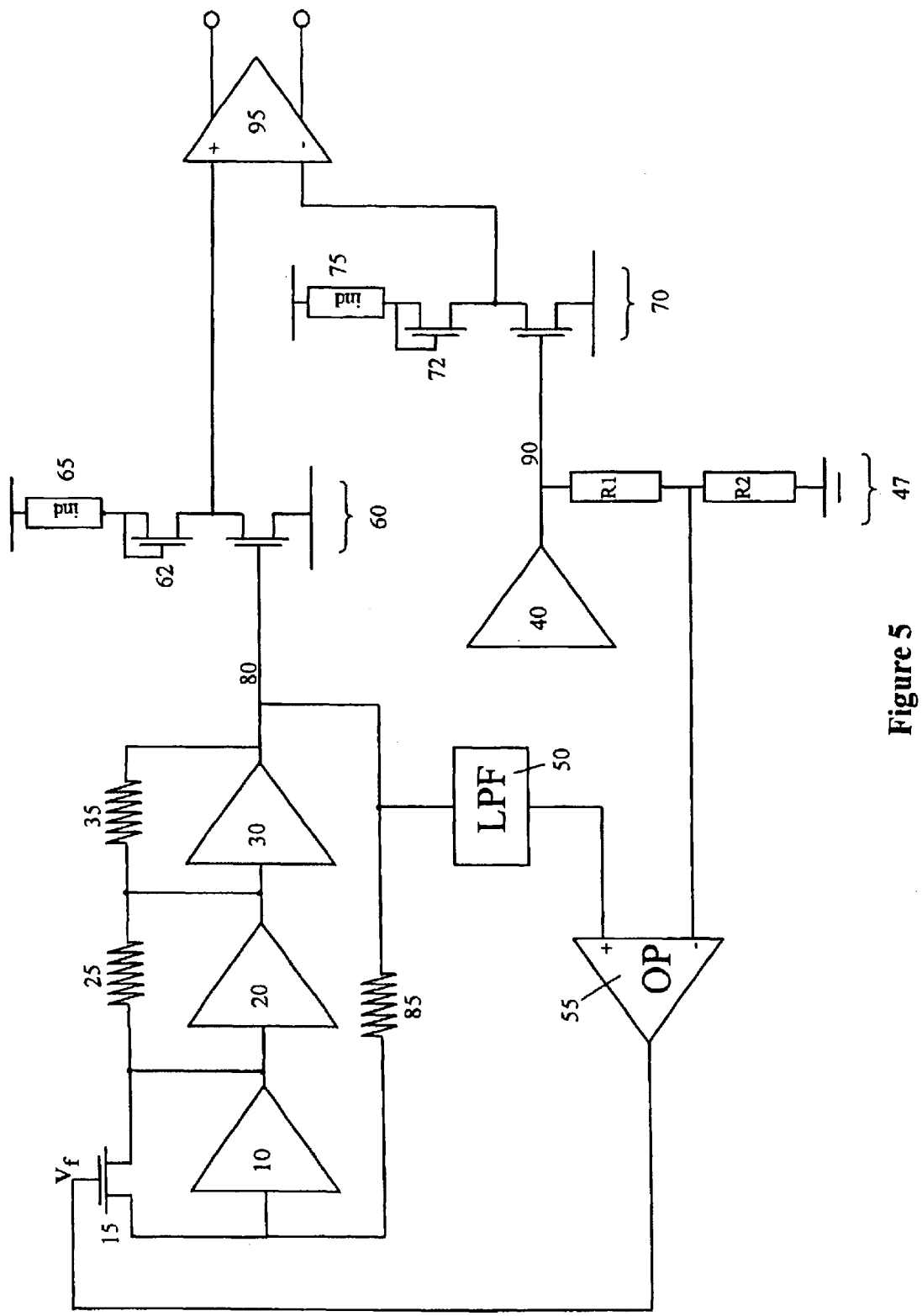
FIG. 5 shows an illustrative example of a multi-stage TIA system with AGC and diode-connected loads according to an embodiment of the present invention.

FIG. 5 shows an illustrative example of a multi-stage TIA system with AGC and diode-connected NMOS loads according to an embodiment of the present invention. In the embodiment, a first common-source amplifier 60 and a second common-source amplifier 70 are utilized between the TIA 100 (see FIG. 3) and the differential amplifier 95. The input of the first common-source amplifier 60 may be coupled to the first output 80 of the TIA, while the output of the first common-source amplifier 60 may be coupled to the first input of the differential amplifier 95. The input of the second common-source amplifier 70 may be coupled to the second output 90 of the replica biasing stage 40, while the output of the second common-source amplifier 70 may be coupled to the second input of the differential amplifier 95. The first common-source amplifier 60 and the second common-source amplifier 70 may contain a diode-connected NMOS load 62, 72, respectively. This configuration allows process-independent gain and level-shifting functions to be realized. The level shifting is achieved because the output is one threshold voltage, $V_{TH}$, below power supply voltage, while the input is one threshold voltage, $V_{TH}$, above ground. Typically, level shifting is done through the use of source-followers, which lead to a voltage gain of less than 1. In the configuration described above, the level shifting stage may also produce voltage gain. Because level-shifting is achieved without sacrificing gain, lossless level-shifting is realized. Moreover, a first equalizing spiral inductor 65 and a second equalizing spiral inductor 75 may be put in series with the diode-connected NMOS load 62, 72, respectively, to compensate for the large Miller capacitance of the differential amplifier 95.

In an optical fiber communications network, there are multiple geographically distributed users writing onto a common optical fiber line. As a result, incoming optical signals from a nearby transmitter may be detected at a high signal level, creating large input current, whereas incoming optical signals from a distant transmitter may be detected at very low signal levels. As such, to be effective, a TIA desirably should be able to detect multiple signal levels, i.e., have a large dynamic range. However, with a large input current, such as 2 mA, the TIA's output swing becomes large. This result can lower the transconductance of the first common-source amplifier 60 and the second common-source amplifier 70, as well as increase the resistance of the diode-connected NMOS load 62, 72. This result may lead to a degraded bandwidth and duty cycle distortion. However, this problem may be mitigated by connecting an NMOS device in parallel with each of the first common-source device 64 (see FIG. 6) of the first common-source amplifier 60 and the second common-source device 74 (see FIG. 6) of the second common-source amplifier 70, and turning them on only when the AGC loop is activated. In other words, the NMOS devices may be turned on, for example, only when large input and output swings occur.

Figure 6:
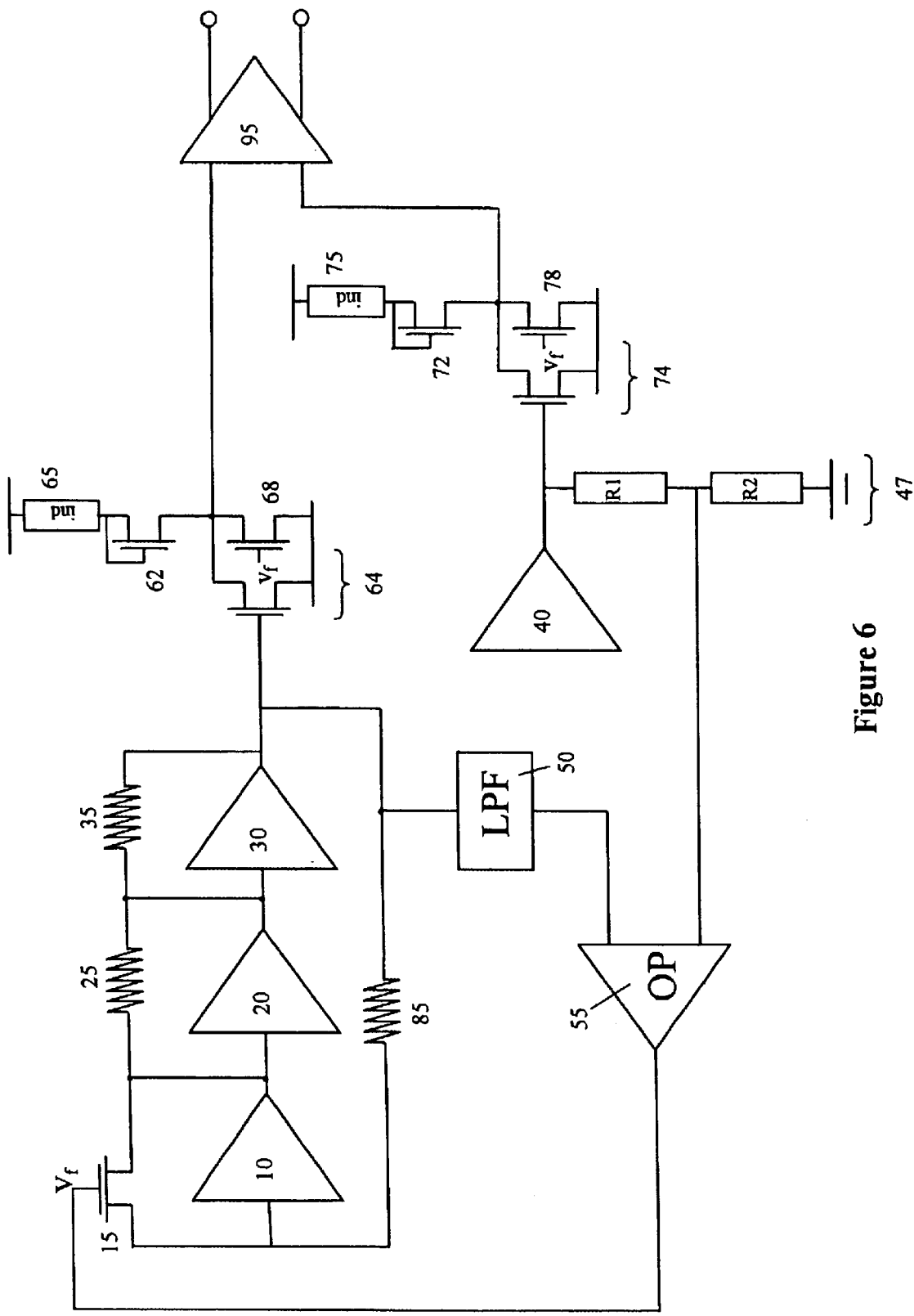
FIG. 6 shows an illustrative example of a multi-stage CMOS TIA system that mitigates bandwidth degradation and duty cycle distortion when a large input is provided to the TIA system according to an embodiment of the present invention.

FIG. 6 shows an illustrative example of a multi-stage CMOS TIA system that mitigates bandwidth degradation and duty cycle distortion when a large input is provided to the TIA system according to an embodiment of the present invention. A first NMOS device 68 is provided in parallel with the first common-source device 64, while a second NMOS device 78 is provided in parallel with the second common-source device 74. The gates of the first NMOS device 68 and the second NMOS device 78 are controlled by the output, $V_f$, of the operational amplifier 55 in the AGC loop. Thus, the first NMOS device 68 and the second NMOS device 78 are turned on only when there are large input and output swings that activate the AGC loop. This configuration may have the effect of lowering the resistance of the diode-connected NMOS load 62, 72, accentuating the equalizing property of the first equalizing spiral inductor 65 and the second equalizing spiral inductor 75, and restoring good duty cycle with a large input. As a result, the TIA can accommodate better than 2 mA of current with minimal duty-cycle distortion.

Figure 7:
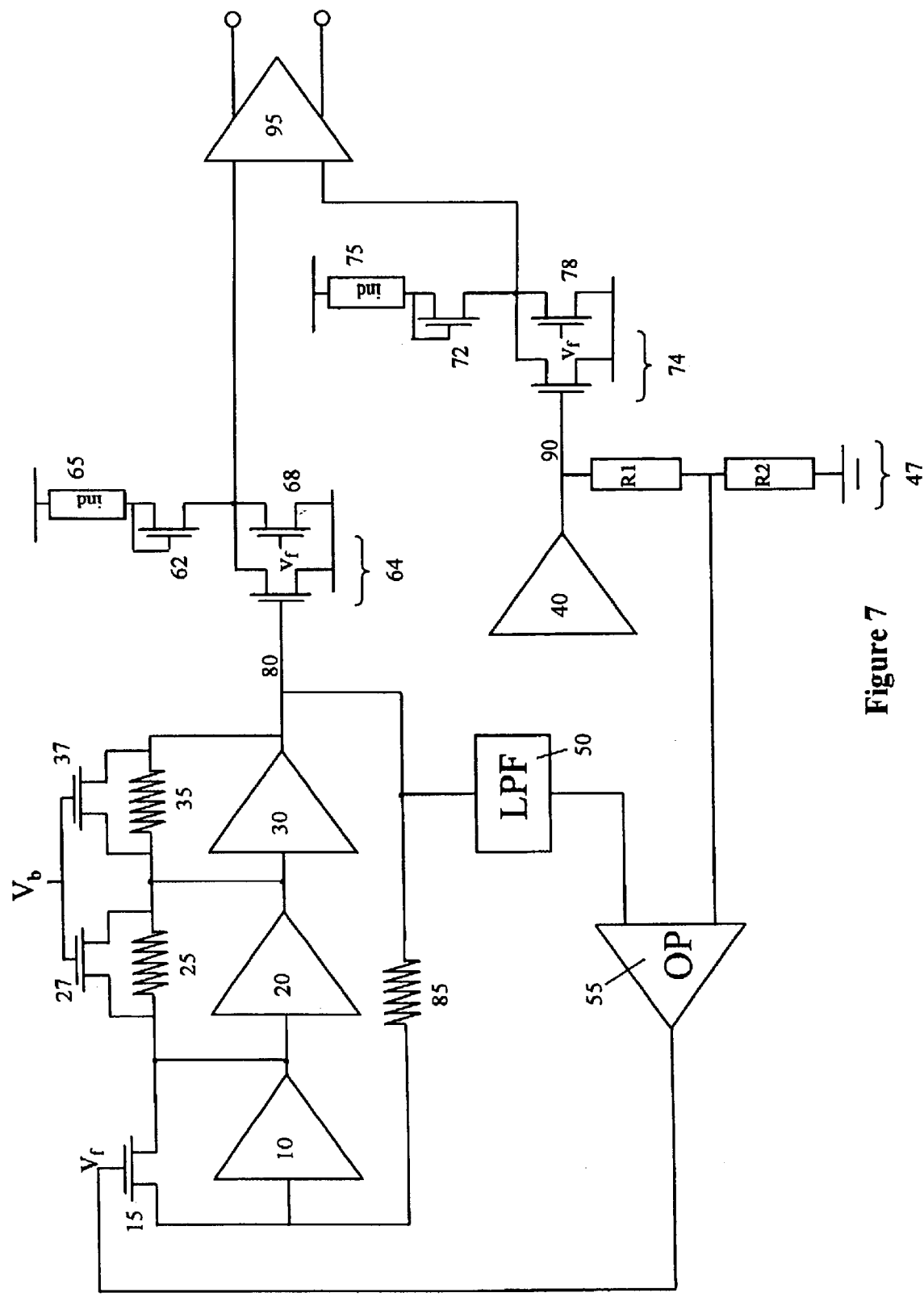
FIG. 7 shows an illustrative example of a multi-stage CMOS TIA system that minimizes performance variation with power supply and temperature according to an embodiment of the present invention.

It is noted that open loop gain of CMOS amplifiers can vary greatly with temperature, leading to fluctuations in the CMOS amplifiers' closed loop bandwidth. FIG. 7 shows an illustrative example of a multi-stage CMOS TIA system that minimizes performance variation with power supply and temperature according to an embodiment of the present invention. However, the TIA system may be designed using any suitable process, such as bipolar or GaAs MESFET. In the embodiment, a first NMOS resistor 27 may be connected in parallel with the first passive feedback element 25 for the second CMOS gain stage 20. A second NMOS resistor 37 may be connected in parallel with the second passive feedback element 35 for the third CMOS gain stage 30. The first NMOS resistor 27 and the second NMOS resistor 37 are essentially transistors biased to function as resistors. The gates of the first NMOS resistor 27 and the second NMOS resistor 37 may be connected to a voltage supply, $V_b$. In a preferred implementation, $V_b$ is the same value as the power supply, which may be 3.3 V. By connecting the first NMOS resistor 27 and the second NMOS resistor 37 in parallel with the first passive feedback element 25 and the second passive feedback element 35, respectively, the bandwidth of the TIA is better controlled. One design consideration may be to weigh the effective impedance of the first NMOS resistor 27 and the second NMOS resistor 37 with respect to the first passive feedback element 25 and the second passive feedback element 35, so that their combined temperature coefficient results in temperature behavior of a well-controlled TIA. Moreover, the first NMOS resistor 27 and the second NMOS resistor 37 in the feedback path may also compensate for variation in the open loop gain as a function of power supply.

Figure 8:
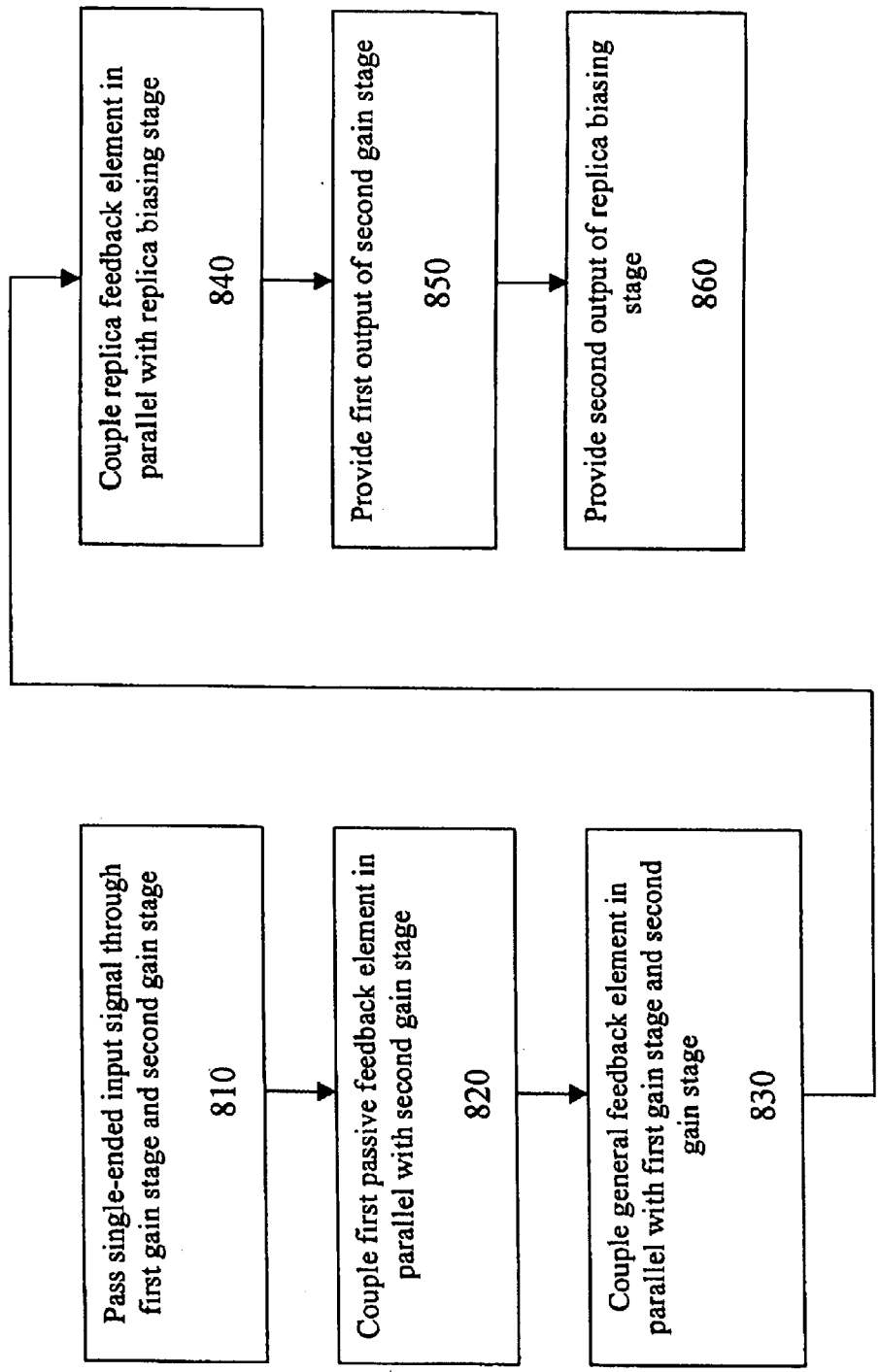
FIG. 8 illustrates a flow chart for a method of converting a single-ended input signal into a differential output signal according to an embodiment of the present invention.

FIG. 8 illustrates a flow chart for a method of converting a single-ended input signal into a differential output signal according to an embodiment of the present invention. Within the method and referring to FIG. 3, a single-ended input signal is passed 810 through at least a first gain stage 10 and a second gain stage 20, and preferably a third gain stage 30. A first passive feedback element 25 is coupled 820 in parallel with the second gain stage 20. A general feedback element 85 may be coupled 830 in parallel with the first gain stage 10 and the second gain stage 20. A replica feedback element 45 is coupled 840 in parallel with a replica biasing stage 40. A first output 80 is provided 850 from the second gain stage 20. A second output 90 is provided 860 from the replica biasing stage 40.

According to an embodiment of the present invention, a third gain stage 30 may be used to generate more gain. The method may further include passing the single-ended input signal through the third gain stage 30, coupling a second passive feedback element 35 in parallel with the third gain stage 30, further coupling the general feedback element 85 in parallel with the third gain stage 30, and providing the first output 90 from the third gain stage 30.

In an embodiment, the method may further include providing the first output 80 (see FIG. 3) of the second gain stage 20 to a first input of a differential amplifier 95, providing the second output 90 of the replica biasing stage 40 to a second input of the differential amplifier 95, and providing the differential output signal from the differential amplifier 95 based on the first output 80 of the second gain stage 30 and the second output 90 of the replica biasing stage 40.

In another embodiment, the method may further include utilizing CMOS technology to create the first gain stage 10, the second gain stage 20, the first passive feedback element 25, the general feedback element 85, the replica feedback element 45, and the replica biasing stage 40.

According to an embodiment, the method may further include providing an automatic gain control ("AGC") loop including coupling a degenerative feed-forward element 15 (see FIG. 4) in parallel with the first gain stage 10, coupling an operational amplifier ("op amp") 55 to the degenerative feed-forward element 15, and coupling a resistor divider network 47 to the replica biasing stage 40 and to a second input of the op amp 55. The method may include coupling a low pass filter ("LPF") 50 to the output of the transimpedance amplifier system 100 and to a first input of the op amp 55. The degenerative feed-forward element 15 may be an NMOS transistor. The gate of the NMOS transistor may be coupled to the op amp 55. The source of the NMOS transistor may be coupled to an input of the first gain stage 10. The drain of the NMOS transistor may be coupled to an output of the first gain stage 10.

In another embodiment, the method may further include receiving an output of the second gain stage 20 in a first common-source amplifier 60 (see FIG. 5) and receiving an output of the replica biasing stage 40 in a second common-source amplifier 70. The first common-source amplifier 60 may include a diode-connected NMOS load 62 and a first common-source device 64 (see FIG. 6). The second common-source amplifier 70 may include a diode-connected NMOS load 72 and a second common-source device 74. The first common-source amplifier 60 may further include a first equalizing spiral inductor 65. The second common-source amplifier 70 may further include a second equalizing spiral inductor 75. The method may further include coupling a first NMOS device 68 in parallel with at least the first common-source device 64 of the first common-source amplifier 60 and coupling a second NMOS device 78 in parallel with at least the second common-source device 74 of the common-source amplifier 70.

According to another embodiment, the method may further include coupling a first NMOS resistor 27 (see FIG. 7) in parallel with the first passive feedback element 25. In yet another embodiment, the method may further include coupling a second NMOS resistor 37 in parallel with the second passive feedback element 35.

Embodiments of the present invention allow the TIA to be implemented with lower costs and higher yields as compared to prior art systems that utilize GaAs MESFET, Bipolar, and similar technologies. The present invention may be implemented in CMOS technology, which is the lowest-cost technology available. CMOS technology is commonly used for implementing central processing units ("CPUs") and random access memory ("RAM") memory cards, two applications that dominate the semiconductor industry. Thus, CMOS technology is sophisticated, widely used, and one of the cheapest technologies available. This implementation makes a chip using CMOS technology less expensive than those designed using GaAs MESFET and Bipolar technologies.

Furthermore, embodiments of the present invention offer a number of distinct advantages over prior art systems, allowing them to operate at and beyond 2.5 Gb/s and to accommodate better than 2 mA of current with minimal duty-cycle distortion. A replica stage is employed to generate a differential output that also provides better power supply noise rejection as compared to the approach using low-pass-filtering, as disclosed in Yoon's "1 Gbit/s fibre channel CMOS transimpedance amplifier," Electronic Letters, vol. 33, no. 7, IEE, pp.588–9, March 1997. A robust gain control technique is introduced that does not require a complex open loop gain regulation scheme as in Khorramabadi's U.S. Pat. No. 5,532,471. The AGC loop employing an operational amplifier and process independent threshold provides a more robust transimpedance gain control mechanism. Common-source followers with diode-connected loads provide process independent gain and lossless level-shifting. On-chip spiral inductors are implemented that equalize the large Miller capacitance of the output stage. An AGC loop drive signal is also used to extend the bandwidth of the TIA with large input current. Passive resistors and NMOS resistors are used in parallel to create a well-behaved temperature response. With the use of multiple gain stages and degeneration schemes as described above to increase bandwidth and control TIA stability, 2.5 Gb/s operation is achieved and better than 2 mA of current may be accommodated with minimal duty-cycle distortion.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A system comprising:
   a photo-detector to generate an input current signal in response to light energy;
   a transimpedance amplifier to generate first and second output signals in response to the input current signal, the differential output signal comprising a first and second output signal; and
   a deserializer to generate a parallel data signal in response to the differential output signal, wherein the transimpedance amplifier further comprises:
   one or more gain stages to provide the first output signal;
   a replica biasing stage to provide the second output signal; and
   a replica feedback circuit coupled in parallel with the replica biasing stage.

2. The system of claim 1, wherein the system further comprises a media access control (MAC) module to receive decoded data based upon the parallel data signal.

3. The system of claim 2, wherein the system further comprises an 8 b/10 b decoder to generate the decoded data based upon the parallel data signal.

4. The system of claim 2, wherein the system further comprises a PCI bus coupled to the MAC module.

5. The system of claim 1, wherein the transimpedance amplifier further comprises a buffer circuit to provide a differential output signal in response to the first and second output signals.

6. The system of claim 1, wherein the transimpedance amplifier further comprises a feedback circuit coupled in parallel with the one or more gain stages.

7. The system of claim 1, wherein the transimpedance amplifier further comprises:
   a plurality of gain stages to generate the first output signal;
   a feedback circuit coupled in parallel with the plurality of gain stages: and
   a feedback circuit coupled across an input and output of one of the gain stages.

8. A transimpedance amplifier comprising:
   one or more gain stages to provide a first output signal in response to an input signal;
   a replica biasing stage to provide a second output signal; and
   a replica feedback circuit coupled in parallel with the replica biasing stage.

9. The transimpedance amplifier of claim 8, the transimpedance amplifier further comprising a buffer circuit to provide a differential output signal in response to the first and second output signals.

10. The transimpedance amplifier of claim 8, the transimpedance amplifier further comprising a feedback circuit coupled in parallel with the one or more gain stages.

11. The transimpedance amplifier of claim 8, wherein the transimpedance amplifier comprises;
    a plurality of gain stages to generate the first output signal;
    a feedback circuit coupled in parallel with the plurality of gain stages; and
    a feedback circuit coupled across an input and output of one of the gain stages.

12. A transimpedance amplifier comprising:
    one or more gain stages to provide a first output signal in response to an input signal;
    a replica biasing stage to provide a second output signal; and
    a feed-forward circuit to affect an amplification gain between the input signal and the first output signal in response to the second output signal.

13. The transimpedance amplifier of claim 12, the transimpedance amplifier further comprising a threshold circuit to activate the feed forward circuit based upon a threshold voltage based, at least in part, on the second output signal.

14. The transimpedance amplifier of claim 13, the transimpedance amplifier further comprising a low pass filter to provide a filtered voltage signal in response to the first output signal, and wherein the threshold circuit activates the feed forward circuit in response to the filtered voltage signal exceeding the threshold voltage.

15. The transimpedance amplifier of claim 13, the transimpedance amplifier further comprising a voltage divider network to generate the threshold voltage in response to the second output signal.

16. A system comprising:
    a photo-detector to generate an input current signal in response to light energy;
    a transimpedance amplifier to generate first and second output signals in response to the input current signal, the differential output signal comprising a first and second output signal; and
    a deserializer to generate a parallel data signal in response to the differential output signal, wherein the transimpedance amplifier comprises:
    one or more gain stages to provide a first output signal in response to an input signal;
    a replica biasing stage to provide a second output signal; and
    a feed-forward circuit to affect an amplification gain between the input signal and the first output signal in response to the second output signal.

17. The system of claim 16, wherein the system further comprises a media access control (MAC) module to receive decoded data based upon the parallel data signal.

18. The system of claim 16, wherein the system further comprises an 8 b/10 b decoder to generate the decoded data based upon the parallel data signal.

19. The system of claim 16, wherein the system further comprises a PCI bus coupled to the MAC module.

20. The system of claim 16, wherein the transimpedance amplifier further comprises a threshold circuit to activate the feed forward circuit based upon a threshold voltage based, at least in part, on the second output signal.

21. The system of claim 20, wherein the transimpedance amplifier further comprises a low pass filter to provide a filtered voltage signal in response to the first output signal, and wherein the threshold circuit activates the feed forward circuit in response to the filtered voltage signal exceeding the threshold voltage.

22. The system of claim 20, wherein tie transimpedance amplifier further comprises a voltage divider network to generate the threshold voltage in response to the second output signal.

* * * * *